(12) United States Patent
Shear et al.

(10) Patent No.: US 9,424,371 B2
(45) Date of Patent: Aug. 23, 2016

(54) CLICK TO ACCEPT AS BUILT MODELING

(75) Inventors: Robert Matthew Shear, Albany, CA (US); James Matson Awe, Santa Rosa, CA (US); Brian A. Pene, San Rafael, CA (US); Eddy Kuo, Concord, CA (US); Keshaba Chandra Sahoo, Berkeley, CA (US)

(73) Assignee: Autodesk, Inc., San Rafael, CA (US)

( * ) Notice: Subject to any disclaimer, the term of this patent is extended or adjusted under 35 U.S.C. 154(b) by 1091 days.

(21) Appl. No.: 13/290,973

(22) Filed: Nov. 7, 2011

(65) Prior Publication Data
US 2012/0116728 A1 May 10, 2012

Related U.S. Application Data

(60) Provisional application No. 61/410,795, filed on Nov. 5, 2010.

(51) Int. Cl.
*G06F 17/50* (2006.01)
*G06T 19/00* (2011.01)

(52) U.S. Cl.
CPC .............. *G06F 17/50* (2013.01); *G06T 19/006* (2013.01); *G06F 17/5004* (2013.01)

(58) Field of Classification Search
CPC ....... G06F 17/50; G06T 15/00; G06T 3/0068; G06T 19/006
USPC .................................. 345/419–420; 701/201
See application file for complete search history.

(56) References Cited

U.S. PATENT DOCUMENTS

| | | | | |
|---|---|---|---|---|
| 6,321,158 | B1* | 11/2001 | DeLorme et al. | 701/426 |
| 8,566,737 | B2* | 10/2013 | Nielsen | G01C 15/00 345/632 |
| 8,572,077 | B2* | 10/2013 | Dorfman et al. | 707/729 |
| 2005/0099637 | A1* | 5/2005 | Kacyra et al. | 356/601 |
| 2010/0214284 | A1* | 8/2010 | Rieffel et al. | 345/419 |
| 2010/0245344 | A1* | 9/2010 | Chen et al. | 345/419 |
| 2011/0316845 | A1* | 12/2011 | Roberts et al. | 345/419 |

OTHER PUBLICATIONS

Marchand et al. "A 2D-3D model-based approach to real-time visual tracking". 2001 Elsevier Science B.V. p. 941-955.*
Macedonia ."Developing Killer Apps for Industrial Augmented Reality". My/Jun. 2004. 2004 IEEE. p. 16-20.*
Schmalstieg et al. "Experiences with Handheld Augmented Realtiy"., 2007 IEEE. 13 Pages.*

* cited by examiner

*Primary Examiner* — Eunhee Kim
(74) *Attorney, Agent, or Firm* — Gates & Cooper LLP

(57) ABSTRACT

A method, system, apparatus, and computer program product provide the ability to augment an as-built model. A CAD drawing of a project as well as a digital representation of a physical implementation of the project are obtained. A relationship that maps the digital representation to the CAD drawing is defined/established. A component of the digital representation is identified based on the relationship (e.g., and a database/catalog). Information about the identified component is transmitted to and displayed on a computer (e.g., a mobile device).

22 Claims, 9 Drawing Sheets

CLICK TO ACCEPT AS BUILT MODELING

CROSS-REFERENCE TO RELATED APPLICATIONS

This application claims the benefit under 35 U.S.C. Section 119(e) of the following co-pending and commonly-assigned U.S. provisional patent application(s), which is/are incorporated by reference herein:

Provisional Application Ser. No. 61/410,795, filed on Nov. 5, 2010, by ROBERT MATTHEW SHEAR, JAMES M. AWE, BRIAN A. PENE, EDDY KUO, and KESHABA C. SAHOO, entitled "CLICK TO ACCEPT AS BUILT MODELING,".

BACKGROUND OF THE INVENTION

1. Field of the Invention

The present invention relates generally to digital modeling, and in particular, to a method, apparatus, and article of manufacture for updating and synchronizing digital models based on real world data.

2. Description of the Related Art

Ninety percent (90%) of plant engineering projects are done on existing "brownfield" plants. Brownfield plants are existing operating facilities that undergo continuous improvement, repair and reconfiguration throughout their lifetime. Many plant design projects now use 3D modeling techniques. Once a plant is built, the 3D model quickly becomes stale as the built plant is modified and reconfigured as needed but the corresponding 3D model is rarely maintained. Laser scanning to capture "as-built" information is becoming very popular but using this information to create accurate model updates requires significant manual guesswork and manipulation. Further, prior art practices for updating digital models are very labor intensive and rely primarily on manual interpretation of as-built data by a CAD (computer aided design) operator.

The person most familiar with the details and configuration of the plant project is the person in the plant who oversaw the installation of the new run of pipe or piece of steel. This person (maintenance lead, operations manager, mechanical lead, instrument technician, etc.) has an intimate knowledge of the plant but spends their days in the plant and rarely sits in front of a personal computer (PC), much less has the time/patience to do the tedious job of updating the as-built model in a CAD application. There exists a need to get information about how a plant was actually constructed or modified back into the 3D model and engineering drawings. This method has to be easy for someone in the field to accomplish and should not require knowledge of a complex CAD program. Such problems may be better understood with a description of digital models and construction.

When building process plants (or other facilities and/or objects), a design may be constrained based on materials. Further, with the improvements in technology, many professional designers/architects/contractors/etc. desire to integrate the digital world with the physical world and the actual building/objects constructed based on or reflected in digital models. Once a building/object is constructed, the building/object is continuously changing (e.g., adding a new valve, updating to accommodate new safety regulations, etc.). Further, persons performing the actual construction/building are often not proficient with modeling programs such as a CAD or solid modeling application. However, such persons are the most knowledgeable about the changes in the resulting construction (e.g., what was cut, the material used, if something was changed to enable it to work). Such changes need to be reflected in the digital model. The problem with updating such designs is that the field technician cannot be expected to input the changes/modifications in the CAD application and similarly, a proficient CAD operator cannot be expected to perform the actual building/construction nor physically visit the plant to confirm the as-built state.

In summary of the above, communication between an engineer/architect or a designer/drafter that is working with digital design documents/data, and a contractor or field technician that is dealing with physical manifestation of those designs can be time-consuming, cumbersome and error-prone due to disjointed workflow that is currently followed and the heterogeneous tools/interfaces available to each role. While a typical engineer is using a technical drawing, such as a CAD drawing, to communicate his design, a technician is looking at a physical object or unassembled parts. Translation between these two views of the world does exist, but it often introduces ambiguities and misunderstandings due to the lack of an effective multi-way communication between the two views—digital and physical.

Examples of Such Prior Art Problems Include:

A CAD drawing created by an engineer/designer/architect can be difficult to understand by a general contractor, and the real-world view of a general contractor cannot be easily translated back into the CAD drawing; and A mechanical CAD drawing created by a mechanical engineer can be difficult to understand by a repair technician. In this regard, a technician often needs to talk to the engineer to resolve any ambiguity about the fitting and construction of the machine.

Another example of prior art limitations exists with respect to augmented reality applications. Augmented reality is the ability to overlay digital content (e.g., text, images, video, 3D objects, etc.) on a live video feed of the real world in real-time and in the case of 3D objects, at the correct parallax. In the prior art, expensive hardware along with sensors and markers were used to track a scene in real-time. With the confluence of smartphone technology (e.g., camera, global positioning system [GPS], compass, accelerometers, etc.), it is now more feasible to implement robust augmented reality applications on consumer smartphones such as Google™ phones, iPhones™, Symbian OS™ phones, and Android™ devices. For example, real-world information may be captured from cameras, video, laser scan, etc. It is desirable to overlay such reality captured information with digital information (e.g., using photogrammetry, special effects, etc.). In an augmented reality application, a 3D model may be overlayed with live video or image data to provide a synchronized view (e.g., a 3D piping model may be overlayed on a video of a building hallway to illustrate the piping in the ceiling panels).

Examples of augmented reality application may vary from visualizing/placing virtual furniture in a live video/image of a room using a portable device (e.g., iPhone™), to overlaying virtual information on images of an automobile to provide maintenance instructions, to providing a virtual x-ray vision, excavation, and asset markup, to performing scene recognition (e.g., an SREngine [scene recognition engine], to performing parallel tracking and mapping [PTAM])). New cellular/mobile devices (e.g., iPhone™, Droid™, etc.) have also enabled a significant number of augmented reality applications (e.g., car finder applications, sun seeker applications, pocket universe™ [an application to find astronomical constellations, or artificially created universes that may synch up with some real locations, etc.].

In view of the above, significant problems exist in the prior art with matching/synchronizing digital models to real-world projects and maintaining a two-way flow of information from digital to as-built and vice versa.

SUMMARY OF THE INVENTION

One or more embodiments of the invention create a mechanism for field personnel to identify areas that differ from an original digital drawing/model, flag these differences, be offered several viable pre-calculated configurations, and "accept change" in a model rather than performing the task of manually updating the model. Such updating can be performed via a handheld device (mobile personal computer [PC], symbol scanner, personal digital assistant [PDA], iPhone™, etc.) or while periodically checking email on a computer. Embodiments of the invention may be utilized with plants (e.g., process plants, industrial plants, etc.) because of the complex nature of the systems that comprise a plant. However, alternative embodiments are not limited to such plants and may be utilized with any building, structure, or object where there may be a difference between the original drawing/plan and what was eventually constructed.

Additionally, there is an objective to matching up/synchronizing a digital model with the real-world that the model represents. In other words, a two-way flow of information is desirable. Such a flow of information can provide for capturing an image of a real-world object/location (e.g., using a cellular device) and recognizing information in the image utilizing a web service/database (i.e., identifying an asset in the image or the location where the image was taken). Similarly, it is desirable to capture a real-world image and have the ability to identify that something is different in the real-world image from the digital model/plans. In such an embodiment, after a picture has been taken, embodiments may recognize the object and send in a work order/change request to modify either the real-world implementation or the model/plan on a server. Thus, embodiments of the invention provide for a two-way flow of information from the digital world to real world and vice versa utilizing tags/information that provide the ability to match real-world assets/objects/information with digital assets/objects/information.

Accordingly, in one or more embodiments of the invention the communication and data exchange problems of the prior art are alleviated by providing mechanisms for both sides (i.e., digital and physical worlds) to communicate in an automatic and intuitive way. Embodiments of the invention allow non-engineering, field users to retrieve and send information for the CAD drawing via a live feed video or camera shot of the real world (the augmented reality environment). The information exchange between the real world and the technical drawing can be performed by estimating the real-world location and orientation of the camera (or camcorder) and then correlating and translating it back into the technical drawing.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

As described above, prior art techniques for updating digital models are labor and time intensive—requiring one hundred percent (100%) human manipulation of as-built data (point cloud, laser scan or image). Embodiments of the invention require zero percent (0%) human manipulation of as-built data.

Think about a very simple corollary of orienting a photograph so that up is up. Such orienting may be performed two ways: (1) The photo is presented the same way regardless of camera orientation where the photo is manually rotated (manipulated) to the right orientation; or (2) all four (4) orientations are provided and the user clicks to accept the desired orientation. In (1) the user needs to know how to rotate (fairly easy task but in three-dimensions (3D) and in a CAD package increases the difficulty). In (2) the user simply needs to pick one of many options. Thereafter, the selection may be transmitted for processing in/by a CAD application. Such an ability to transmit images that orient a technician within a real building provides a unique advantage over that of the prior art.

Embodiments of the present invention may present a valuable advantage by removing all specialized application knowledge from the engineering-construction-update cycle. If there is an existing model, an attempt is made to match the as-built results to the existing model. To enable such a matching, a mechanism/system for capturing the actual "real-world" information may be provided. As used herein, real-world is used interchangeably with "as-built". Even if a pipe run is designed a certain way, such a design may be changed in the field when an unanticipated problem or obstacle is identified. Accordingly, embodiments of the invention provide a mechanism to contribute as-built information in a manner that doesn't impact the existing workflow and does not require knowledge of CAD.

Similarly, in one or more embodiments, information in a digital model may be tagged or identified as corresponding to a particular type of real-world information. The tagging/identifying/matching process provides the ability to train a system to more easily identify information/assets/objects captured in a real-world image/video. Thereafter, during an object recognition process, the system is able to narrow down or filter the list of potential objects that correspond to an area of an image. Various methods can be used to narrow down the list of available options that can then be presented to the user for confirmation and further use.

Hardware Environment

Figure 1:
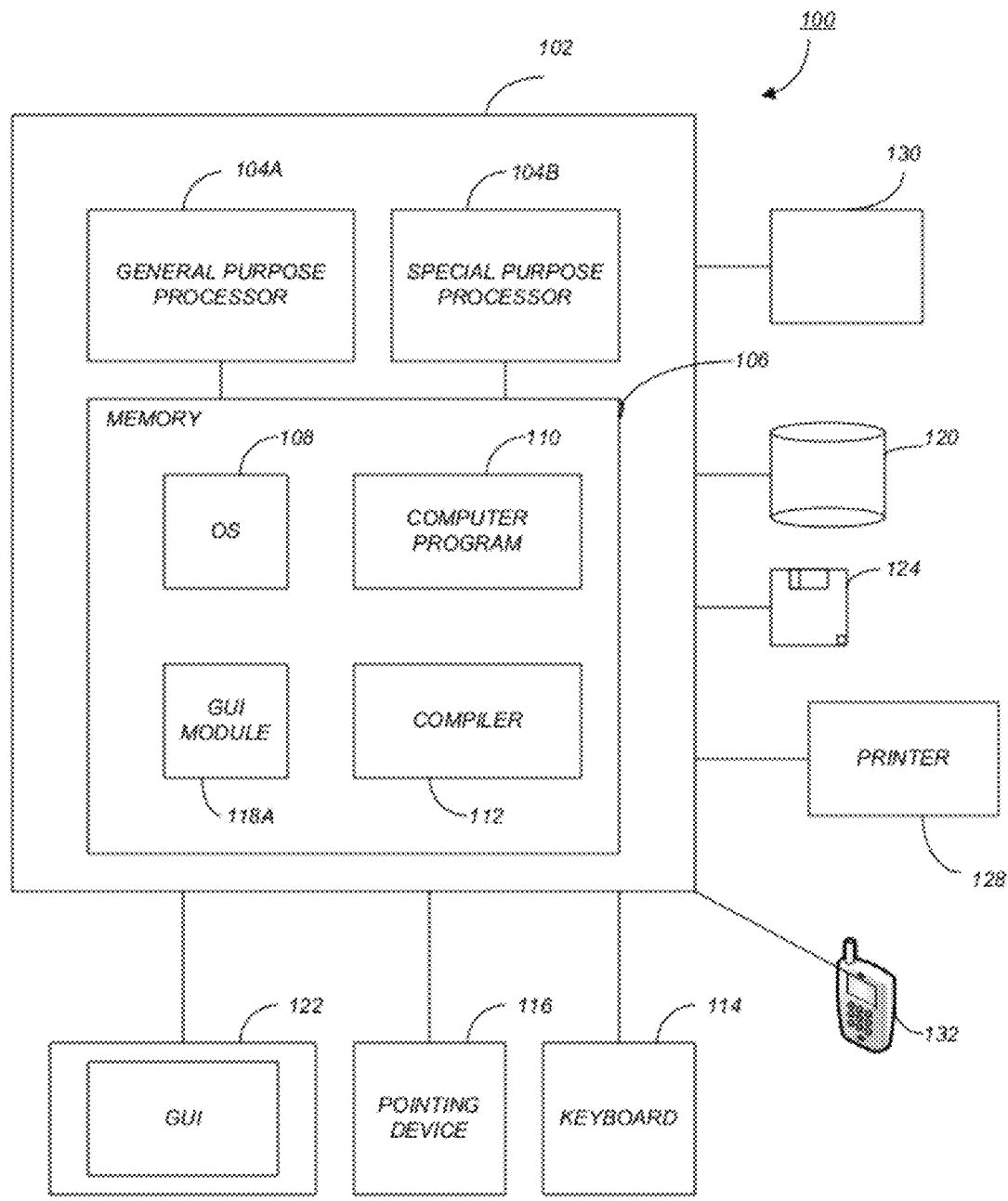
FIG. 1 is an exemplary hardware and software environment used to implement one or more embodiments of the invention.

FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM).

The computer 102 may be coupled to other devices, including input/output (I/O) devices such as a keyboard 114, a cursor control device 116 (e.g., a mouse, a pointing device, pen and tablet, etc.), a printer 128, and/or a field device 132 that has a camera/screen and ability to enter simple text and click on objects. Such a field device 132 includes any type of electronic display interface that is portable/mobile (e.g., a portable digital device, mobile/portable computing device, laptop computer, wearable computer, tablet PC, cellular device, personal digital assistant, digital camera, camcorder, digital video camera, laser scanner, bar code reader, etc.). Such a field device 132 may or may not be communicatively coupled to computer 102 and may communicate with one or more other field devices, servers, computers, or devices across a cellular or other network.

Further, computer 102 may operate as a client computer, server computer, or any other type of computer that is enabled to execute functions and receive information from field device 132 (e.g., via a network [e.g., cellular network] or directly from field device 132). In addition, computer 102 may comprise a thin client device with limited or full processing capabilities, portable devices such as cell phones, mobile devices, notebook computers, pocket computer, multi-touch based display devices, and/or any other device with suitable processing, communication, and input/output capability.

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108 to provide output and results.

Output/results may be presented on the display 122 or provided to another device for presentation or further processing or action. In one embodiment, the display 122 comprises a liquid crystal display (LCD) having a plurality of separately addressable liquid crystals. Each liquid crystal of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118A. Although the GUI module 118A is depicted as a separate module, the instructions performing the GUI functions can be resident or distributed in the operating system 108, the computer program 110, or implemented with special purpose memory and processors.

In one or more embodiments, the display 122 is integrated with/into the computer 102 and comprises a multi-touch device having a touch sensing surface (e.g., track pod or touch screen) with the ability to recognize the presence of two or more points of contact with the surface. Examples of multi-touch devices include mobile devices (e.g., iPhone™, Nexus S™, Droid™ devices, etc.), tablet computers (e.g., iPad™, HP Touchpad™), portable/handheld game/music/video player/console devices (e.g., iPod Touch™, MP3 players, Nintendo 3DS™, PlayStation Portable™, etc.), touch tables, and walls (e.g., where an image is projected through acrylic and/or glass, and the image is then backlit with LEDs).

Some or all of the operations performed by the computer 102 according to the computer program 110 instructions may be implemented in a special purpose processor 104B. In this embodiment, some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program instructions. In one embodiment, the special purpose processor is an application specific integrated circuit (ASIC).

The computer 102 may also implement a compiler 112 which allows an application program 110 written in a programming language such as COBOL, Pascal, C++, FORTRAN, or other language to be translated into processor 104 readable code. After completion, the application or computer program 110 accesses and manipulates data accepted from I/O devices and stored in the memory 106 of the computer 102 using the relationships and logic that was generated using the compiler 112.

Computer program 110 may comprise a building information model (BIM) that is capable of utilizing building model content and its related metadata (e.g., a CAD application and associated metadata). Such metadata may include any information within a CAD model such as the last date something was serviced, location, manufacturability, cost, etc. Further, the content and metadata managed by computer program 110 may include three dimensional information, photographs, imagery, video, CAD geometry, text, accompanying documentation, and any information provided by field device 132. Such a field device 132 may comprise a cellular device, portable computer, personal digital assistant, scanning device, etc. In other words, field device 132 comprises any type of portable hardware device with sufficient processor and memory capabilities to enable the performance of the functionality described herein.

The computer 102 also optionally comprises an external communication device such as a modem, satellite link, Ethernet card, or other device for accepting input from and providing output to other computers.

In one embodiment, instructions implementing the operating system 108, the computer program 110, and the compiler 112 are tangibly embodied in a computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program instructions which, when accessed, read and executed by the computer 102, causes the computer 102 to perform the steps necessary to implement and/or use the present invention or to load the program of instructions into a memory, thus creating a special purpose data structure causing the computer to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device," and "computer program product" as used herein are intended to encompass a computer program accessible from any computer readable device or media.

Of course, those skilled in the art will recognize that any combination of the above components, or any number of different components, peripherals, and other devices, may be used with the computer 102.

Although the term "user computer" or "client computer" is referred to herein, it is understood that a user computer 102 may include portable devices such as cell phones, notebook computers, pocket computers, or any other device with suitable processing, communication, and input/output capability.

Click-To-Accept As-Built Modeling

One or more embodiments of the invention utilize a field device 132 to update a digital model of a real world object/structure. To enable such capabilities, various applications and methodologies may be utilized.

An application 110 is created that accepts scanned point cloud data (e.g., from field device 132), references a content catalog of components (e.g., in database 120), and creates several possible options for review. For example it may be unclear if an installed pipe is 5" steel or 6" alloy; each option could be offered to the field tech (e.g., using device 132) and he/she could "accept" the correct option. This could also be an iterative process where each round of approximations is closer than the last based on the technician's responses.

A direct manipulation feature may be added that allows the field tech to grab and place components to match the as-built configuration. The key is that this should not require CAD knowledge.

Many advantages are provided by embodiments of the invention including:

1) Provides a one-click way for the person with direct project knowledge to interact with the as-built model without requiring CAD expertise;

2) Automates the inevitable back-and-forth between the CAD operator and the field tech; and 3) Streamlines as-built model validation to keep model current for other uses.

One or more of the following specific steps may be utilized to practice the invention:

1) Perform a plant project;

2) Once completed, a survey crew performs a laser scan of the area or a technician takes several pictures from different angles;

3) A preliminary as-built model is created from laser scan information or pictures;

4) The system generates multiple configurations based on estimated geometry and reference to an available parts catalog;

5) Multiple options are offered to a field tech/device user for review. For example, if pump 1 was in the design, but the engineer who actually built the plant used pump 2, the field technician or person responsible for updating the model should be offered several different options;

6) The technician chooses the representation that most closely matches the update;

7) The technician submits the change. The change is transmitted via sms/email/http to the drawing file (e.g., a computer-aided design [CAD] application accepts the change) and the change is identified as either: (a) "Accept Change": An acceptable change—the representation is close enough to the actual as-built modification for inclusion in the model (and the user accepts the change); or (b) "Closest Version": The change is a close version and the suggested representation is on the right track. If option (b) is identified by the user, more iterations may be performed until the user can choose "Accept Change"; and 8) Accepted Changes are added to the plant model. In order for the changes to be added to the plant model, the location of the change in the CAD file and the actual location in the plant would have to be synchronized. Such synchronization may be achieved in several different ways. Examples of synchronization techniques that may be used (either alone or in combination) include: (a) GPS (global positioning system) coordinates; (b) Landmarks within both the file and the actual plant; and (c) a grid system within the drawing.

The changes that might be made to the CAD file might be routings for pipes, wires, or other assemblies. All changes may require some sort of way to orient the user input (e.g., technician photograph or laser scan) to the orientation of the CAD drawing. In this regard, once a user has transmitted an image of a particular location and the user input (e.g., image) is oriented with the CAD drawing, options may be presented to the user. For example, the user may be presented with a set of choices in order to orient the change. Many newer cameras may include GPS and orientation data in the photos. In many cases, such orientation information is not necessary. Instead, only the approximate location of the user may be necessary to understand where the image came from. Other possible additions might include matching point cloud data to existing models.

Augmented Reality

In addition to clicking-to-accept as built modeling as described above, embodiments of the invention may provide the ability for a mobile augmented reality system for asset management.

Embodiments of the invention provide the ability to perform 2D information tag overlays. With 2D information tag overlays, 2D tags of asset information (text docs, photos, audio, video, URLs, etc.), that are overlaid on the real world via live video feed from a mobile camera, can be created, viewed and edited. Markups can be drawn on a screen using a touch interface or keypad while viewing and saving tags and markups with information to share with stakeholders, designers and engineers.

Others can then view with their own mobile device at the same location or over the web via a map interface with tagged points of interest related to the same locations viewed on the mobile phone's augmented reality application. The application could be tied in to a backend asset management solution (e.g., IBM Maximo™) for better integration with lifecycle and maintenance management software.

In one or more additional embodiments, 3D tracking technology may be provided. With 3D tracking, a user may point a phone's camera at a location in the real world to see a virtual 3D model overlaid on a live video feed.

Exemplary applications include architectural visualization and x-ray vision. With architectural visualization, a virtual 3D Building may be viewed overlaid on a real world building site, allowing the user to walk around the virtual building's exterior or walk through the interior on site before it has been built. In an x-ray vision application, infrastructures like beams and ducts in the walls may be viewed overlaid on a live video of a building interior scene or pipes in the ground overlaid on a live video of the street.

To enable augmented reality applications, scene recognition engines and/or parallel tracking and mapping techniques may be used to allow high fidelity tracking without requiring markers or sensor to achieve accurate overlays. For example, components from RealViz-Camera Factory™ may be utilized. Alternative mobile augmented reality frameworks/browsers including Layar™ with possible mobile hardware including the Android™ phone or iPhone™ (which devices may or may not allow formal access to the camera for image processing and manipulation [e.g., via an application programming interface]).

Figure 2:
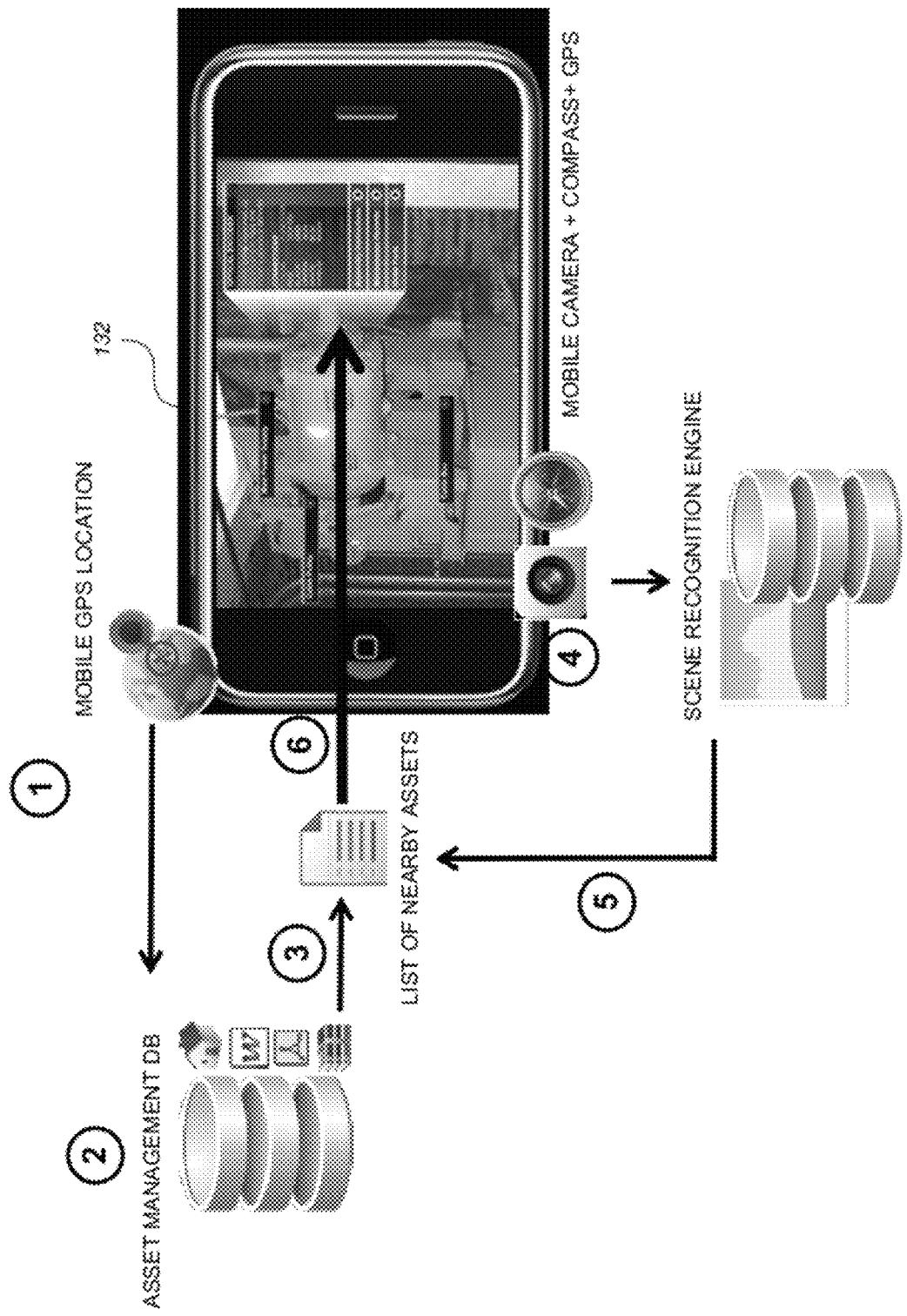
FIG. 2 illustrates a hardware configuration that can be utilized in accordance with one or more embodiments of the invention.

FIG. 2 illustrates a hardware configuration that can be utilized in accordance with one or more embodiments of the invention. At step 1, the GPS location is used to identify a users general location.

At step 2, an asset management database finds nearby assets based on the GPS location.

At step 3, a list of nearby assets is sent back to the mobile device for later lookup.

At step 4, live video feed from the camera (in the mobile device) sends images to a scene recognition engine to identify the scene that the user is viewing. This makes the entire image of the camera the marker allowing tracking based on individual real world assets in the scene.

At step 5, the scene recognition engine identifies the scene and creates an index for correlation with a list of nearby assets sent in step 3.

At step 6, asset tags are overlaid and tracked on live video feed in real-time. As illustrated, the field device 132 contains a mobile camera, compass, and GPS information (that are used to enable the augmented reality shown).

Figure 3:
FIG. 3 illustrates an enlarged version of the display area of a device of FIG. 2 in accordance with one or more embodiments of the invention.

FIG. 3 illustrates an enlarged version of the display area of device 132 of FIG. 2. The display area illustrates a live image/video that has been overlayed with labels identifying the various objects/elements displayed. Further, additional options are presented to the user in the display area allowing the user to obtain additional information. For example, the user may select the "+" button from the various text areas to display additional information relating to the main power supply, the cable pulley, and/or the cable box. Additional information relating to the optical encoder is illustrated and may be hidden by selecting the "−" icon. Within the optical encoder display dialog box, the user can view relevant information and further click to view assembly instructions, maintenance records, and/or to order parts.

The scene recognition engine is a software engine utilized to recognize static scenes of architectures, streets, posters, rooms, etc. An exemplary engine that may be utilized is SREngine™ available from Kousei, Inc (see www.srengine.com). For example, given an image in a field device 132, a scene recognition engine would recognize various objects in the scene (e.g., a telephone, a menu, a couch/bench, etc.) and identify them (e.g., using text labels or other identifiers) to provide an augmented reality.

Due to the ability to specify what a user is watching in real-time in a very strict manner, a scene recognition engine can be used in a wide range of augmented reality applications. A scene recognition engine client may include real time image processing, a field device (e.g., iPhone™OS 2.2, no Jailbreak™), no external device (sensor), developed with Apple™ Xcode Iphone SDK™, and may have objective-C and c language image processing. A server for the scene recognition engine may provide pattern matching, LAMP (open source software providing Linux™, Apache™ HTTP Server, MySQL™ database, and PHP™), the Linux™/Mac OSX™ operating system, Apache™ with Django™ web server, a SQLite3/MySQL™ database, and the Python™ programming language.

Further, to perform parallel tracking and mapping, a camera tracking system for augmented reality may be utilized. Such a system would track points on static objects in a scene as a camera is moved (e.g., in real-time dynamically). An exemplary tracking system that may be used in embodiments of the invention is that of PTAM™ available from George Klein at www.robots.ox.ac.uk/~gk/. Such a PTAM™ system may require no markers, pre-made maps, known templates, or inertial sensors.

Figure 4:
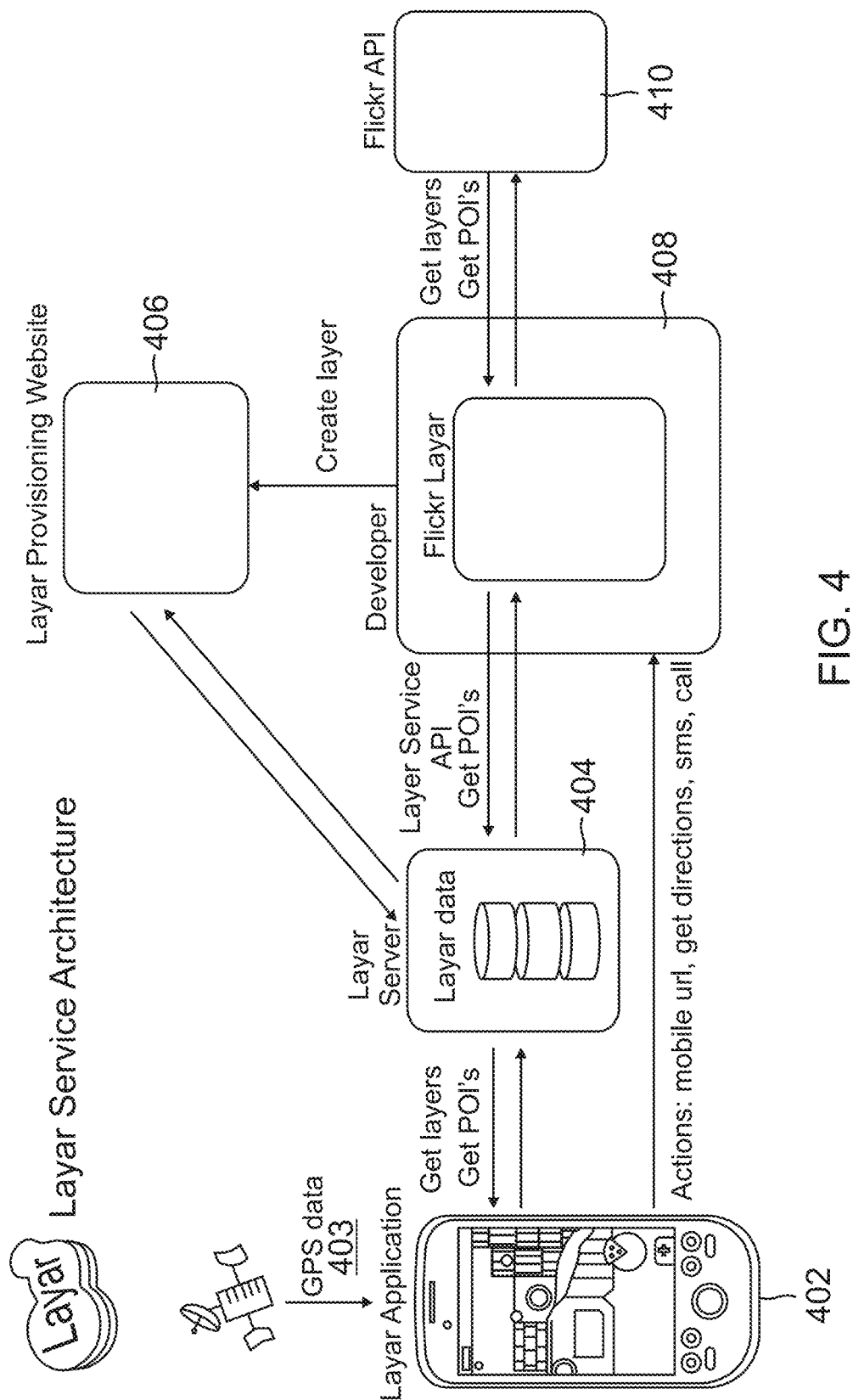
FIG. 4 illustrates a service architecture used by Layar™ in accordance with one or more embodiments of the invention.

Various mobile augmented reality developer tools may also be utilized to enable embodiments of the invention. For example, Layar™ (www.layar.com) provides a global augmented reality browser that is available for the Iphone™ 3GS™, T-Mobile™ G1™, HTC™ Magic™ and other Android™ phones in all Android™ markets. Layar™ may also come pre-installed on certain cellular devices in different countries (e.g., Netherlands). Developers can create customized augmented reality applications known as "Layers" that can be loaded into such augmented reality browsers. Numerous prior art applications can be loaded onto various cellular devices in the prior art. FIG. 4 illustrates a service architecture used by Layar.™

As illustrated in FIG. 4, a Layar™ application executes on a mobile device 402 and receives GPS data 403. A Layar™ server 404 provides interfaces to the Layar™ application, the Layar™ provisioning platform 406, and external Layar™ service providers 408. The Layar™ provisioning platform/website 406 is a website on which developers can submit new layers and manage their layers and accounts. The Layar™ service providers 408 are created by developers such as Flickr™. Content sources provide content to view viewed in a Layar™ browser, such as Flickr™. Layer content sources may not be separated from the Layar™ service providers 408 but may generally be different logical entities, as existing geo-coded databases and web services may not support the developer API. Interfaces may be displayed to third parties by a Layar™ client API (i.e., the interface between the Layar™ server 404 and Layar™ app 402. The Layar™ developer API is the interface between the Layar™ server 404 and the Layar™ service providers 408. Developers can create their own layers (e.g., the Flickr™ API 410) and submit them via the provisioning website 406 to be added to the Layar™ service.

Figure 5:
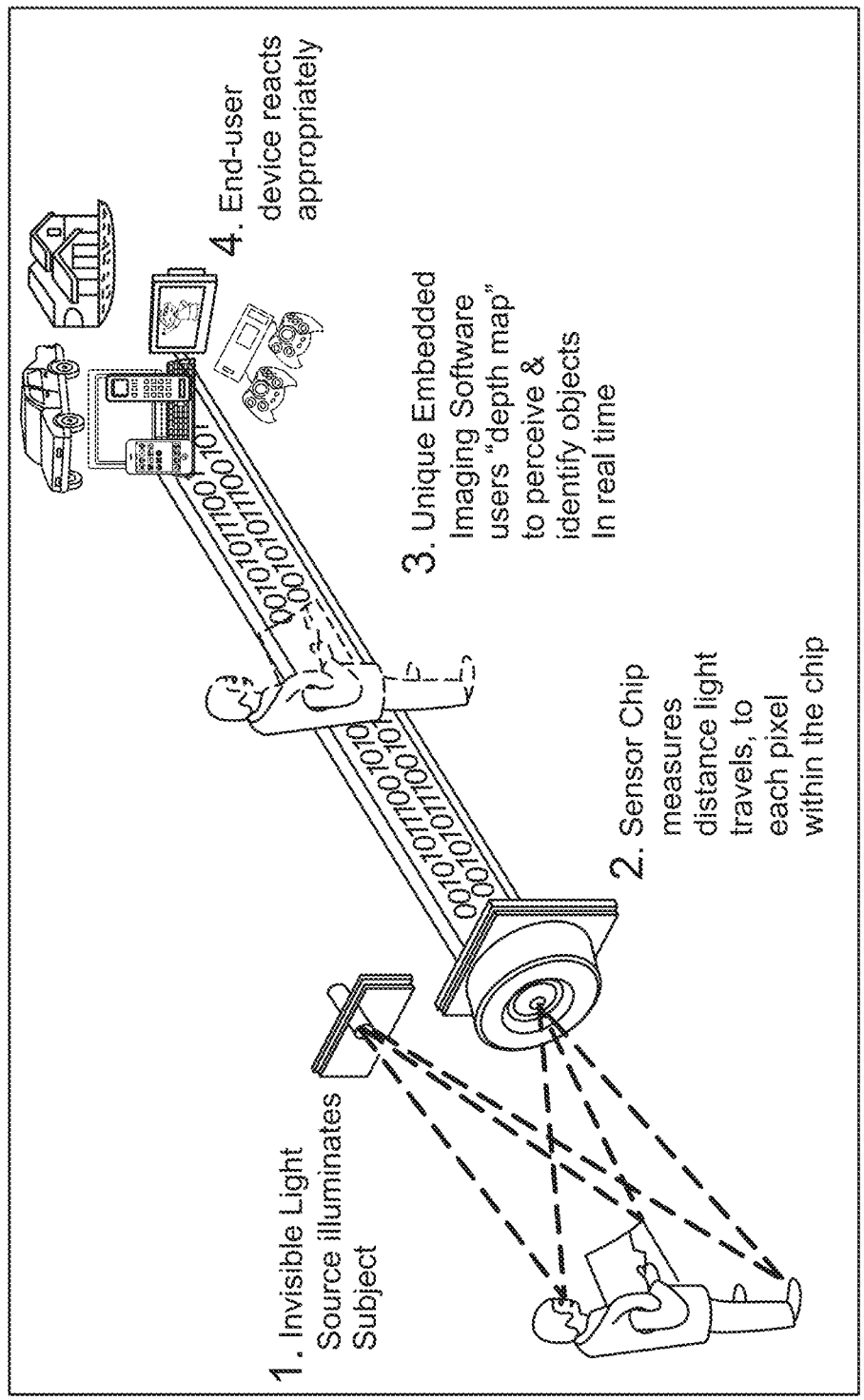
FIG. 5 illustrates the architecture for utilizing technology from Canesta™ in accordance with one or more embodiments of the invention.

In addition to the above, 3D tracking may be improved with additional hardware like sensor cameras using IR and time-of-flight processing allowing potential for sub-CM accuracy, clash detection and measurements. For example, technology available from Canesta™ may be utilized. FIG. 5 illustrates the architecture for utilizing technology from Canesta™ in accordance with one or more embodiments of the invention. As illustrated, an invisible light source (1) illuminates a subject and the reflected light is received at a sensor chip (2) that measures the distance the light travels to each pixel within the chip. Unique embedded imaging software uses a "depth map" to perceive and identify objects in real time (3). the result is the ed-user device reacting appropriately at (4).

In view of the above, embodiments of the invention provide the ability for bi-directional communication between the digital and real world. In this regard, given specification driven constraints (e.g., in a processing or industrial plan, or given a particular subset of information), only a limited number of options are available for changes with respect to a digital/real world model. Image capture (e.g., scanner, iPhone™, camera, etc.) is used and the image is placed into a building information system.

The building information system then utilizes artificial intelligence to determine pattern recognition (e.g., providing ~six options for a modification). Such artificial intelligence may utilize one or more pieces of information available and potential options can be progressively limited based on known attributes. For example, GPS, compass, and accelerometer based information may all be used. GPS can provide a range (e.g., 20-30 yards). The GPS location can be used as a key into a database on the backend to retrieve a general idea of items/objects in range. The accelerometer and compass information can then be used to further narrow selections from the database (e.g., to retrieve a list of assets or to narrow down the list of assets).

A feedback loop with the field technician may then be used—e.g., the options are presented to the field technician to click to accept the desired option. Alternatively, the field technician may have the option of selecting the closest option wherein the system would then reprocess to present additional/new options to the technician for selection.

In view of the above, it may be seen that the more a system is utilized to recognize scenes and objects, the more accurate such a system becomes. For example, a scene shape may utilize a marker/tag as previously identified to recognize a corner of a building, an office phone inside, an object outside, etc. to modify the list of potential options. Accordingly, the list of options presented to a user may be progressively narrowed based on data available to the application. Once sufficiently narrowed, virtual objects or identifiers can then be overlayed onto objects in an image (e.g., as illustrated in FIG. 3). Thus, the field technician/user is utilized to confirm information and identify/tag assets to enable more efficient and accurate recognition of objects and the correlation between a real-world scene and a digital model.

Bi-directional Technical Data Exchange and Collaboration

In view of the above descriptions, various steps may be utilized to correlate and provide for the exchange of information between a real world and corresponding digital model. The description illustrate the steps that can be utilized in one or more approaches followed by a real-world example.

Figure 6:
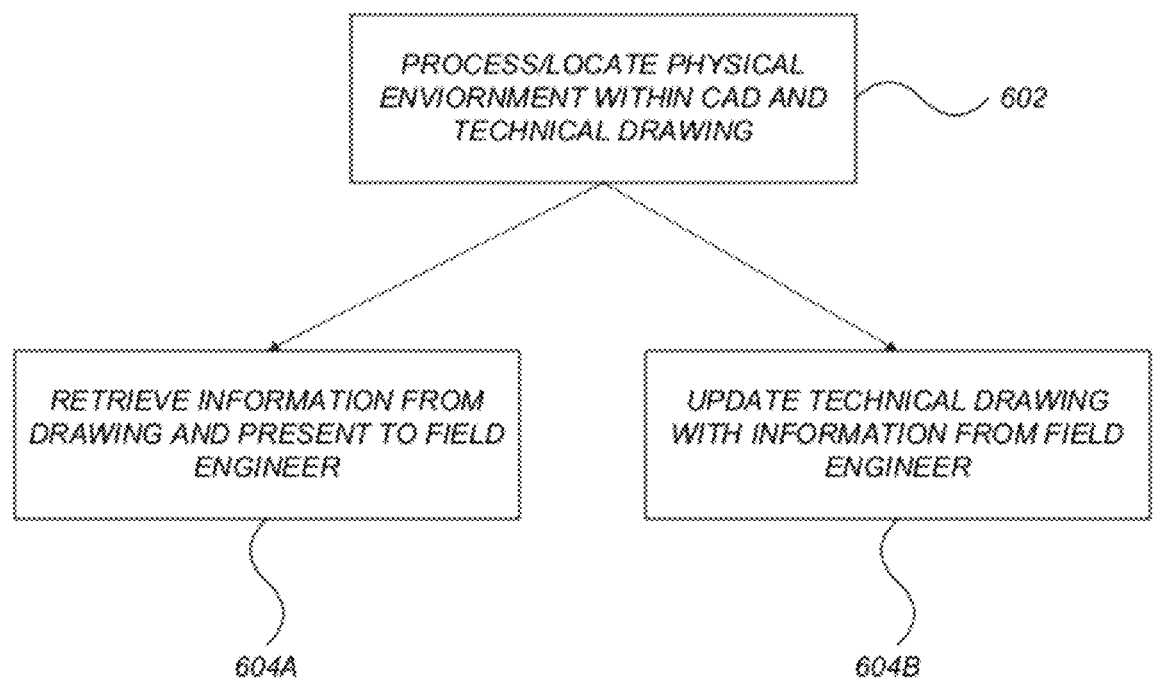
FIG. 6 is a flowchart illustrating the logical flow for exchanging information between the real and digital worlds in accordance with one or more embodiments of the invention.

FIG. 6 is a flowchart illustrating the logical flow for exchanging information between the real and digital worlds in accordance with one or more embodiments of the invention.

At step 602, the physical environment is processed and located within the CAD and technical drawing. Step 602 may include three or more sub-steps.

At step 602(i), high definition images of the environment of interest are captured/taken, e.g. a building, interior of a building, or a mechanical part.

At step 602(ii), the images are processed and the camera location and orientation are estimated with respect to a local coordinate system.

At step 602(iii), the local coordinates are associated with the technical drawing (digital model), such that the origin and coordinate axes are the same. This step is a change of axes operations that can be performed by applying a linear transformation on the technical drawing.

Steps 602(i) and 602(ii) may be repeated to compensate for different lighting conditions.

From step 602, step 604A or step 604B may be performed.

At step 604A, information is retrieved from the technical drawing/digital model and presented to a field engineer/technician. Three or more sub-steps may be performed during step 604A.

At step 604A(i), the casual user may be equipped with a mobile device that has a GPS, and a camera (or camcorder).

At step 604(ii), the camera location and orientation are estimated in the current view from the preprocessed step. This step can be done by searching the closest match images from the preprocessed step. From the matching images (for which the camera location and orientation has already been estimated), the new camera location and orientation can be estimated.

At step 604(iii), the new estimated camera location and orientation are used to deduce what the user is currently looking at with respect to the technical drawing (since they have the same coordinate). The relevant information can then be retrieved from the technical drawing and presented to the casual user.

At step 604B, the technical drawing/digital model is updated with information from the field engineer. Four or more sub-steps may be performed as part of step 604B.

At step 604B(i), the casual user is equipped with a mobile device that has a GPS, and a camera (or camcorder).

Similar to step 604A(ii), at step 604B(ii), the camera location and orientation is estimated from the current view.

At step 604B(iii), the casual user is allowed to draw, markup, or comment on the mobile device via a touch screen interface or pointing device.

At step 604B(iv), similar to 604A, the markup or comment may be sent back to the technical drawing by using the new estimated camera location and orientation.

To demonstrate the approach of FIG. 6, a real-life scenario is presented where the communication barrier between the two parties is greatly reduced. The example, is that of the information exchange between an architect and a plant engineer.

An architect is designing a piping layout in a factory. The plant engineer is surveying the plant and commenting on the new design. Step 602 is performed first by taking images (e.g., hundreds of pictures) in the plant using a 12 Mega bit pixel camera. A computer vision algorithm program may be executed to estimate the camera location and orientation of where the images are taken.

The plant engineer is equipped with a mobile device with touch screen and a built-in GPS enabled camera. Note that this camera does not have to be the high resolution camera used in step 602.

Figure 7:
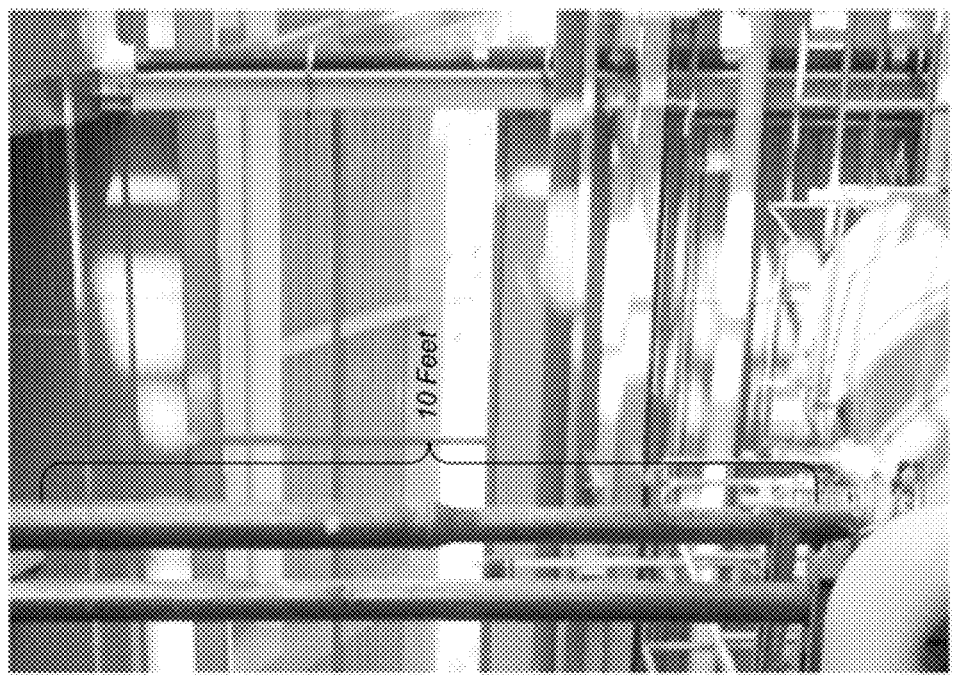
FIG. 7 illustrates the data exchange from a CAD drawing to real-world view in accordance with one or more embodiments of the invention.
Figure 7:
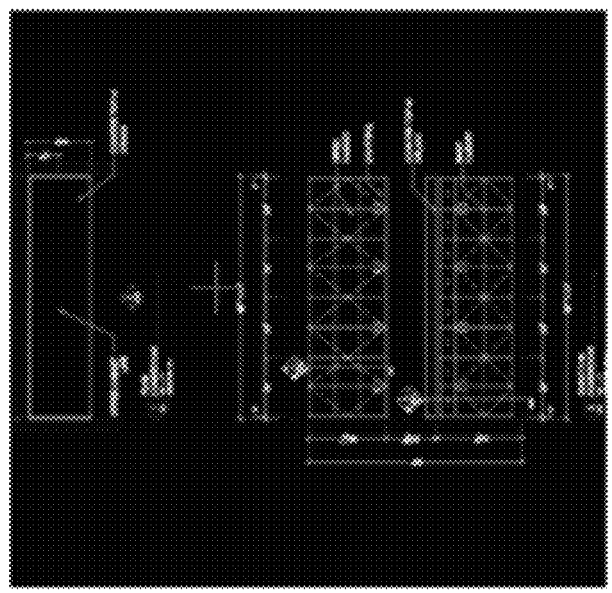

The plant engineer is looking at a pipe through his mobile device camera view. By using step 604A, the plant engineer is able to retrieve the dimension of the pipe. This information is overlaid on his mobile device as showed in FIG. 7 (i.e., the bracket and corresponding text callout of "10 Feet"). Accordingly, FIG. 7 illustrates the data exchange from a CAD drawing to real-world view. The left image of FIG. 7 shows the CAD drawing created by an architect and the right image shows what the plant engineer will see through his mobile camera device. The information about the height of the pipe is retrieved from the CAD drawing and overlay onto the mobile camera view with the right perspective.

Figure 8:
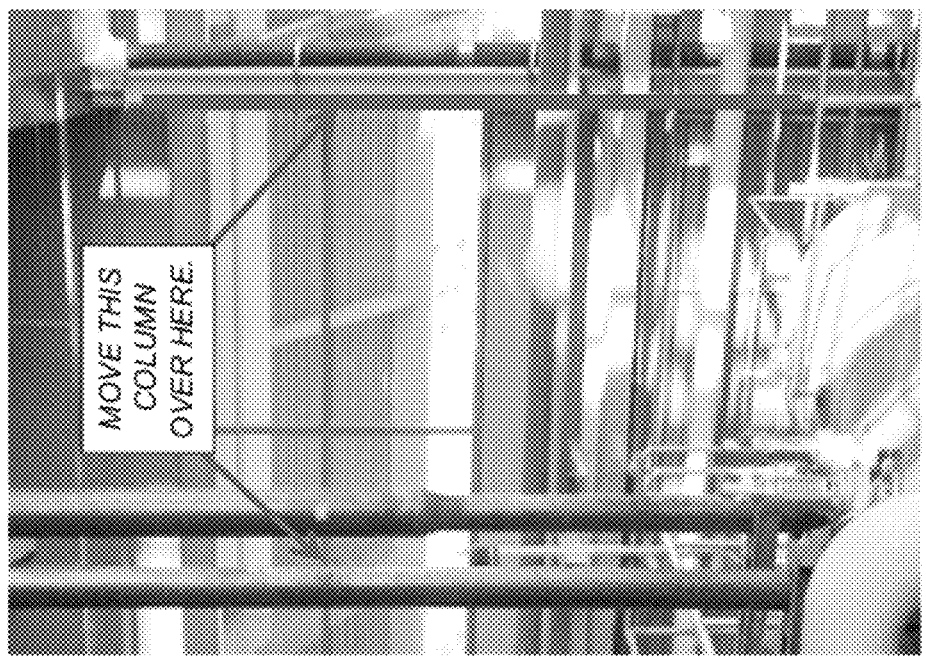
FIG. 8 illustrates the data exchange from a real-world view to a CAD drawing in accordance with one or more embodiments of the invention.
Figure 8:
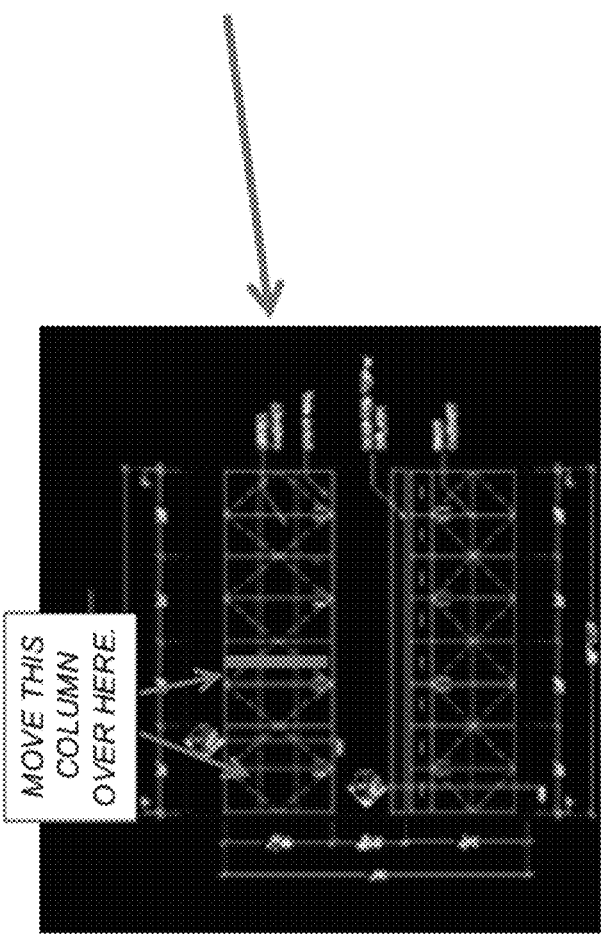

Next, the plant engineer desires to make a comment about a pipe location, and how the design could introduce conflict in the existing layout. The plant engineer point his mobile device to the area of which he wants to comment on, and he creates a markup with text and arrows on his mobile device touch screen. This markup is translated back into the technical drawing using step 604B, and the architect can see this markup in the right location in his CAD drawing as shown in FIG. 8. Accordingly, FIG. 8 illustrates the data exchange from a real-world view to a CAD drawing.

In FIG. 8, the left image shows the CAD drawing and the right image is what the plant engineer will see through his mobile camera device. The plant engineer draws a markup on his mobile camera device using the touch screen or pointer device (i.e., to move a column from one location to another location). This markup is sent back and overlaid on the CAD drawing (in the left image) in the right location.

Logical Flow

Figure 9:
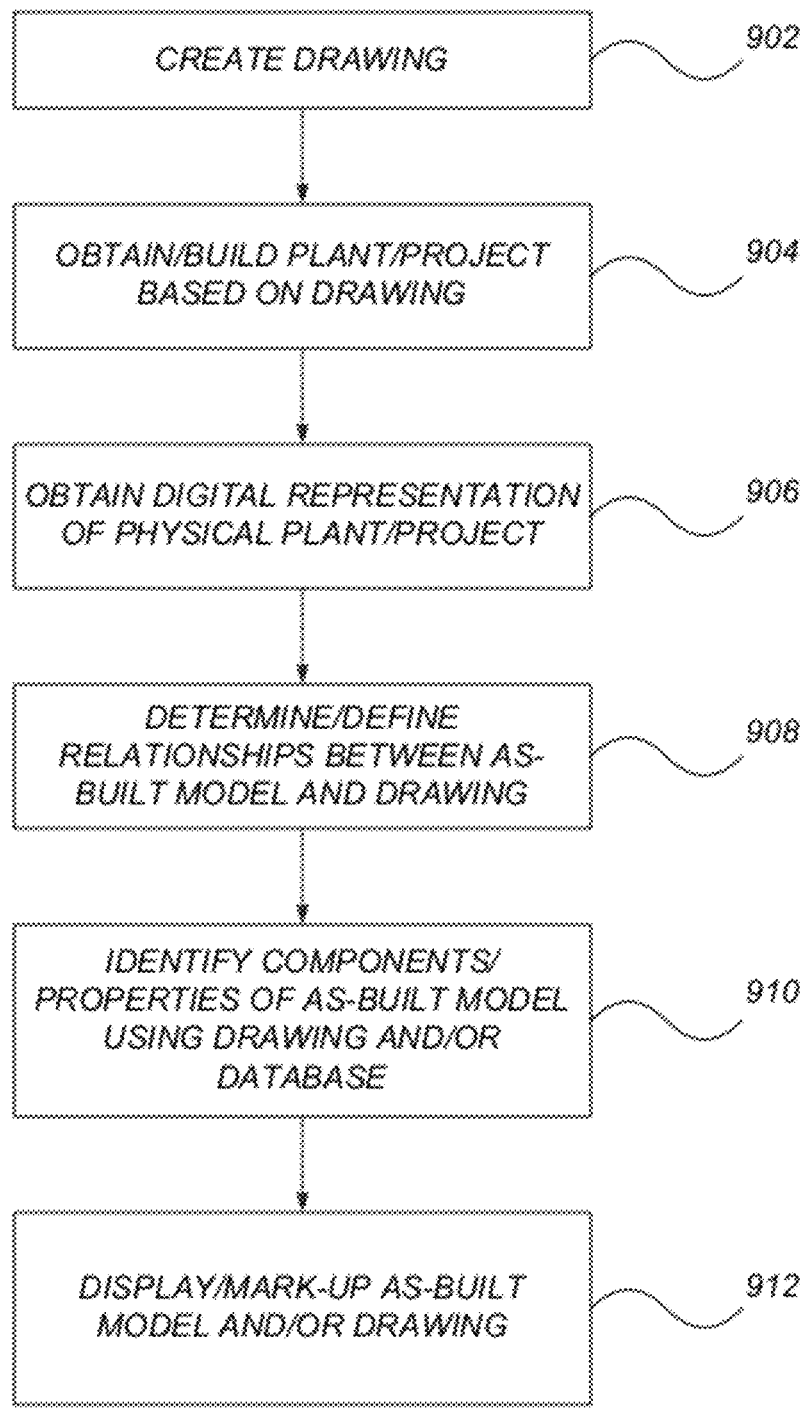
FIG. 9 illustrates the logical flow for augmenting an as-built model in accordance with one or more embodiments of the invention.

FIG. 9 illustrates the logical flow for augmenting an as-built model in accordance with one or more embodiments of the invention. At step 902, a CAD drawing of a project is obtained (e.g., created or retrieved).

At step 904, a physical plant/project is obtained/built based on the CAD drawing.

At step 906, a digital representation (e.g., as-built model) of the physical plant/project is obtained. Such a digital representation may be obtained using a camera (e.g., in a mobile phone or personal digital assistant) to capture digital images/video feed of the physical plant/project. Alternatively, a laser scan may be conducted to obtain point cloud data.

At step 908, a relationship between the as-built model/digital representation and the CAD drawing is defined/established. The relationship maps the digital representation to the CAD drawing. To define the relationship, the location and orientation of a user (i.e., that captured the digital images) may be estimated with respect to a local coordinate system. The location may then be associated with the CAD drawing such that an origin and coordinate axes of the digital representation and CAD drawing are mapped to each other. Alternatively, a landmark from the digital representation may be mapped to a corresponding landmark in the CAD drawing.

At step 910, a component of the digital representation is identified based on the relationship. The identification process may reference a content catalog/database to determine two or more component options for selection by a user. Such options may then be transmitted to a client/user device that receives input from the user identifying which of the options more closely resembles the component in question. The input may then be returned to a server device (e.g., a device configured to maintain the CAD drawing) where the CAD drawings are updated accordingly. The option presentation/selection/update process may be repeated until the user confirms that the correct component has been identified.

At step 912, information about the identified component is transmitted to a client device/computer (e.g., portable/mobile device) that is configured to display the information. Such information may be tag overlays that contain asset information about the identified component. Further, such information may be tracked and displayed in real time as part of a live video feed on the client device. Such a client device may comprise a thin client device such as a mobile phone or device with limited processing capabilities (e.g., a personal digital assistant, tablet device, etc.). Further, to enable the capabilities described herein, the client device may have an image capture mechanism (e.g., camera) and location capabilities (e.g., GPS).

In addition to or as part of the above steps, the user may draw a markup on the digital representation (e.g., using a tablet or mobile device). Such a markup may then be transmitted to the hosting device to update/store with the CAD drawing. In an augmented reality application, a virtual 3D model that is based on the CAD drawing may be transmitted and displayed by overlaying the virtual 3D model onto the digital representation (e.g., on a client computer/mobile device).

Conclusion

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

In view of the above, while the limited overlay of information may be available in the real-world (augmented reality) of the prior art, embodiments of the invention provide a multi-way/multi-directional information exchange between the real world and digital data, e.g. CAD drawings. Furthermore, the exchanged information is 3D graphics, in addition to text for tagging, requiring not just identification, but also location and orientation in 3D space by creating a 3D scene from images and video.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for augmenting an as-built model comprising:
    (a) obtaining, in a first computer, a computer-aided design (CAD) drawing of a project;
    (b) receiving, in the first computer from a second computer, a digital representation of a physical implementation of the project;
    (c) defining, in the first computer, a relationship that maps the digital representation to the CAD drawing;
    (d) identifying, in the first computer, a component of the digital representation based on the relationship, wherein the identifying comprises a feedback loop that is performed until a specific CAD component is identified, the feedback loop comprising:
        (1) referencing a content catalog to determine two or more component options for selection by a user;
        (2) the transmitting transmits the tow or more component options to the second computer; and
        (3) the second computer is configured to receive input from the user identifying which of the two or more component options more closely resembles the component;
        (4) repeating the above feedback loop steps progressively narrowing the two or more component options until the specific CAD component is identified; and
    (e) receiving, in the first computer, the identification of the specific CAD component identified from the second computer;
    (f) updating, in the first computer, the CAD drawing based on the identification; and
    (g) transmitting, from the first computer to the second computer, information about the identified component, wherein the second computer is configured to display the information.

2. The method of claim 1, wherein the digital representation comprises a digital image of the physical implementation.

3. The method of claim 1, wherein the digital representation is obtained by laser scanning.

4. The method of claim 1, wherein the defining the relationship comprises:
estimating a location and an orientation of a user in the digital representation with respect to a local coordinate system; and
associating the location in the digital representation with the CAD drawing such that an origin and coordinate axes of the digital representation and the CAD drawing are mapped to each other.

5. The method of claim 1, wherein the defining the relationship comprises:
mapping a landmark from the digital representation to a corresponding landmark in the CAD drawing.

6. The method of claim 1, wherein:
the information comprises tag overlays comprising asset information about the identified component.

7. The method of claim 1, further comprising:
receiving, in the first computer from the second computer, a markup drawn by a user on the digital representation displayed by the second computer.

8. The method of claim 1, further comprising:
transmitting a virtual 3D model that is based on the CAD drawing, from the first computer to the second computer, wherein:
the information comprises the virtual 3D model; and
the virtual 3D model is displayed by overlaying the virtual 3D model onto the digital representation displayed by the second computer.

9. The method of claim 1, wherein:
the information about the identified component is tracked and displayed in real time on live video feed by the second computer.

10. The method of claim 1, wherein:
the second computer comprises a mobile thin client device configured with an image capture mechanism and location capabilities.

11. An apparatus for augmenting an as-built model displayed on a mobile device comprising:
(a) the mobile device having a memory; and
(b) an application executing on the mobile device, wherein the application is configured to:
(i) obtain a digital representation of a physical implementation of a project;
(ii) transmit the digital representation to a first computer, wherein the first computer is configured to:
(1) maintain a computer-aided design (CAD) drawing of the project;
(2) define a relationship that maps the digital representation to the CAD drawing; and
(3) identify a component of the digital representation based on the relationship and by performing a feedback loop until a specific CAD component is identified, the feedback loop comprising:
(A) referencing a content catalog to determine two or more component options for selection by a user; and
(B) the mobile device is configured to: receive the two or more component options from the first computer; obtain input from the user identifying which of the two or more component options more closely resembles the component; repeating the above feedback loop steps progressively narrowing the two or more component options until the specific CAD component is identified; and transmit the identification of the specific CAD component to the first computer, wherein the first computer is configured to update the CAD drawing based on the identification;
(iii) receive, from the first computer, information about the identified component; and
(iv) display the information.

12. The apparatus of claim 11, wherein the digital representation comprises a digital image of the physical implementation.

13. The apparatus of claim 11, wherein the digital representation is obtained by laser scanning.

14. The apparatus of claim 11, wherein the relationship is defined by:
estimating a location and an orientation of a user in the digital representation with respect to a local coordinate system; and
associating the location in the digital representation with the CAD drawing such that an origin and coordinate axes of the digital representation and the CAD drawing are mapped to each other.

15. The apparatus of claim 11, wherein the relationship is defined by:
mapping a landmark from the digital representation to a corresponding landmark in the CAD drawing.

16. The apparatus of claim 11, wherein:
the information comprises tag overlays comprising asset information about the identified component.

17. The apparatus of claim 11, wherein the mobile device is further configured to:
obtain markup drawn by a user on the mobile device, on the digital representation; and
transmit the markup to the first computer.

18. The apparatus of claim 11, wherein the mobile device is further configured to:
receive a virtual 3D model that is based on the CAD drawing, from the first computer, wherein the information comprises the virtual 3D model; and
display the virtual 3D model by overlaying the virtual 3D model onto the digital representation.

19. The apparatus of claim 11, wherein the mobile device is further configured to:
track and display the information about the identified component in real time on live video feed.

20. The apparatus of claim 11, wherein:
the mobile device further comprises an image capture mechanism and location capabilities.

21. The method of claim 7, wherein:
the markup drawn by the user marks up a particular component of the digital representation; and
the method further comprises displaying, via the first computer, the markup, on the CAD drawing, in an appropriate location on the CAD drawing, based on the relationship that maps the digital representation to the CAD drawing.

22. The apparatus of claim 17 wherein:
the markup drawn by the user marks up a particular component of the digital representation; and
the application is further configured to display, via the first computer, the markup, on the CAD drawing, in an appropriate location on the CAD drawing, based on the relationship that maps the digital representation to the CAD drawing.

* * * * *